United States Patent

Hirano

[19]

[11] Patent Number: 6,134,142
[45] Date of Patent: *Oct. 17, 2000

[54] REDUNDANCY METHOD AND A DEVICE FOR A NON-VOLATILE SEMICONDUCTOR MEMORY

[75] Inventor: Yasuaki Hirano, Yamatokoriyama, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/276,776

[22] Filed: Mar. 25, 1999

[30] Foreign Application Priority Data

Mar. 25, 1998 [JP] Japan .................................. 10-077560

[51] Int. Cl.$^7$ .................................................. G11C 16/06
[52] U.S. Cl. ...................................... 365/185.09; 365/200
[58] Field of Search ........................ 365/185.09, 185.16, 365/185.24, 185.26, 200

[56] References Cited

U.S. PATENT DOCUMENTS 5,526,307  6/1996  Yiu et al. ........................... 365/185.01

FOREIGN PATENT DOCUMENTS 4-014700  1/1992  Japan .
7-230700  8/1995  Japan .

OTHER PUBLICATIONS

Hirano et al. (1997–05). "A Sesing Scheme for a ACT flash memory,"*Technical Report of the Institute of Electronics Information and Communication Engineers, ICD 97–21*,pp. 37–42. English Abstract Only.

Nozoe. (1995–05). "32 Mb and Flash Memory,"*Technical Report of the Institute of Electronics Information and Communication Engineers, ICD 95–39*, pp. 63–68. English Abstract Only.

Tsao et al. (Jun. 8–10, 1995). "A 5V–only 16M Flash Memory Using A Contactless Array of Source–Side Injection Cells,"*1995 Symposium on VLSI Circuits: Digest of Technical Papers 10–2*,pp. 77–78.

Yamauchi et al. (Dec. 10–13, 1995). "A New Cell Structure for Sub–Quarter Micron High Density Flash Memory,"*International Electron Devices Meeting Technical Digest 95*, pp. 267–270.

*Primary Examiner*—David Nelms
*Assistant Examiner*—David Lam
*Attorney, Agent, or Firm*—Morrison & Foerster LLP

[57] ABSTRACT

In a non-volatile semiconductor memory composed of floating gate field effect transistors arranged in rows and columns forming an array, a redundancy method is provided which includes the steps of: providing one or more column lines for redundancy, in which floating gate FETs in a number as many as the row lines of the array are connected; when a defect occurs in a column line, setting the thresholds of at least all the floating gate FETs connected to the defective column line, to the high state; and using as the substitute memory, the floating gate FETs for redundancy connected to redundancy column lines in a number as many as those of the floating gate FETs of which the thresholds are set in the high state.

6 Claims, 12 Drawing Sheets

|  | BL0 | BL1 | BL2 | BL3 | BL4 | BL5 | BL6 | BL7 | BL8 | Readout data pass-fail state |
|---|---|---|---|---|---|---|---|---|---|---|
| M0 : Readout | 1 | (0) Voltage rise | F | 1 | 1 | 0 | 0 | 1 | 1 | × |
| M1 : Readout | 1 | 1 | F | 0 | 1 | 1 | 0 | 0 | 1 | × |
| M2 : Readout | 0 | 1 | F | 0 | 0 | 1 | 1 | 0 | 0 | × |
| M3 : Readout | 0 | 0 | F | (1) Voltage drop | 0 | 0 | 1 | 1 | 0 | × |

F : floating

| | BL0 | BL1 | BL2 | BL3 | BL4 | BL5 | BL6 | BL7 | BL8 | Readout data pass-fail state |
|---|---|---|---|---|---|---|---|---|---|---|
| M0 : Readout | 1 | 0 | 0 | 1 | 1 | 0 | 0 | 1 | 1 | OK |
| M1 : Readout | 1 | 1 | ⓪ Voltage rise | 0.5 | 0.5 | 1 | 0 | 0 | 1 | × |
| M2 : Readout | 0 | 1 | 1 | 0 | 0 | 1 | 1 | 0 | 0 | OK |
| M3 : Readout | 0 | 0 | ① Voltage drop | 0.5 | 0.5 | 0 | 1 | 1 | 0 | × |
| M4 : Readout | 1 | 0 | 0 | ① | ① Voltage drop | 0 | 0 | 1 | 1 | × |
| M5 : Readout | 1 | 1 | 0 | 0.5 | 0.5 | ① Voltage drop | 0 | 0 | 1 | × |
| M6 : Readout | 0 | 1 | 1 | 0 | 0 | 1 | 1 | 0 | 0 | OK |
| M7 : Readout | 0 | 0 | 1 | 1 | 0 | 0 | 1 | 1 | 0 | OK |

0.5 : Intermediate voltage output due to short-circuit

| | BL0 | BL1 | BL2 | BL3 | BL4 | BL5 | BL6 | BL7 | BL8 | Readout data pass-fail state |
|---|---|---|---|---|---|---|---|---|---|---|
| M0 : Readout | 1 | 0 | 0 | 1 | 1 | 0 | 0 | 1 | 1 | OK |
| M1 : Readout | 1 | 1 | 0 | 0 | 1 | 1 | 0 | 0 | 1 | OK |
| M2 : Readout | 0 | 1 | 0 | 0 | 0 | 1 | 1 | 0 | 0 | × |
| | | | Voltage drop | | | | | | | |
| M3 : Readout | 0 | 0 | 0 | ① | 0 | 0 | 1 | 1 | 0 | × |
| | | | | Voltage drop | | | | | | |
| M4 : Readout | 1 | 0 | 0 | 1 | 1 | 0 | 0 | 1 | 1 | OK |
| M5 : Readout | 1 | 1 | 0 | 0 | 1 | 1 | 0 | 0 | 1 | OK |
| M6 : Readout | 0 | 1 | 0 | 0 | 0 | 1 | 1 | 0 | 0 | OK |
| M7 : Readout | 0 | 0 | 0 | 1 | 0 | 0 | 1 | 1 | 0 | OK |

0.5 : Intermediate voltage output due to short-circuit

H : High vt cell

H : High vt cell

REDUNDANCY METHOD AND A DEVICE FOR A NON-VOLATILE SEMICONDUCTOR MEMORY

BACKGROUND OF THE INVENTION (1) Field of the Invention

The present invention relates to a semiconductor memory, in particular to a virtual ground memory array having redundant functions, made up of floating gate type non-volatile semiconductor memory cells.

(2) Description of the Related Art

In recent years, virtual ground type flash memory devices aiming for high packing density have drawn attention, such as for example, 'A New Cell Structure for Sub-quarter Micron High Density Flash memory' (IEDM Technical Digest, pp.269–270, 1995), and an ACT (Asymmetrical Contactless Transistor) type flash memory disclosed in 'An investigation of a sensing method of an ACT type flash memory' (ICD97–21, p37, 1997, Technical Report of the Institute of Electronics Information and Communication Engineers).

FIG. 1 is a sectional view showing the structure of an ACT type flash memory cell. In the memory cell (storage element) structure, a drain region 2 and source regions 3A and 3B are formed with n-type impurities over a p-type well 1 with a predetermined distance therebetween, while a control gate 4 for applying the gate voltage is formed across the gap between drain 2 and sources 3A and 3B. Control gate 4 is formed in layers with a control gate layer 5, an inter-layer insulating film 6, a floating gate 7 and a tunnel oxide film 8. This cell is featured such that the donor density directly below the floating gate 7 differs between the drain 2 side and the source 3 side.

In an ACT type flash memory, data write operations (to be referred to as program operations) and data erasing operations (to be referred to as erase operations) are implemented based on the FN tunnel effect, and it is expected to be used for data storage.

For an ACT type flash memory, it is important to enhance the speed of serial data reading and the speed of programming (verifying). For example, the array of a flash memory is configured of a NAND, AND or other types. These array configurations perform read, program (verify) and other operations on one word-line basis. That is, fast operations can be realized by determining the data by sensing the signals for one word line at the same time.

Since an ACT type flash memory has a virtual ground type array configuration as shown in FIG. 3, it is necessary to perform 4 cycle or 8 cycle read operations (one cell for four bits or one cell for eight bits) when taking into account the influences of read upon other memory cells. The method of reading based on this scheme will be described with reference to FIG. 3.

For simplicity, the drawing in FIG. 3 shows three word lines (row lines) WL0 to WL2 with nine bit lines (column lines) BL0 to BL8.

For example, when a four cycle read operation is performed, for reading cells M1 and M5, which are encircled in FIG. 3, upon the first cycle, the two adjacent bit lines containing the target cell are applied with 1(V) and 0(V), respectively, while two adjacent bit lines containing the cells which are not the reading targets are applied with 0(V)–0(V), 1(V)–1(V), or 0(V)–1(V). Thus, bit lines BL0 through BL8 are applied with voltages "1, 1, 0, 0, 1, 1, 0, 0, 1" (V: volt), in this order.

This reading technique enables reading free from influence upon other memory cells even with a virtual ground configuration.

One of the necessary techniques for such memory devices in order to improve the production yield is the redundancy method. Referring first to FIG. 4, bit-line failure in a conventional flash memory of a NOR type array will be described. Examples of failures are as follows:

X1: bit line open

X2: Short-circuit between one bit line and source line (common source);

X3: Short-circuit between bit lines; and

X4: Short-circuit between one bit line and the substrate.

FIG. 4 shows part of a flash memory circuit for a conventional NOR type array configuration which has an unillustrated page buffer and performs programming on the word-line basis or for each word line WL1, 2 or 3 as a unit. Each bit line BL0–BL4 has a sense amplifier SA0–SA4. This circuit further includes a redundant array 9.

The read (verify) operation by this NOR type array configuration is found in 'A 32 Mb AND type flash memory' (ICD95–39, p63 (1995), Technical Report of the Institute of Electronics Information and Communication Engineers).

First, all the bit lines BL are pre-charged and then one word line WL is set to a high level so that the signals are compared with the reference voltage to determine the data. That is, the data is latched by latch type sense amplifiers SA. The data is sequentially selected by the column decoder (designated at 10) to be output to an unillustrated output buffer.

When the data is latched by sense amplifiers SA in the NOR array type flash memory as stated above, if the array has defects such as X1, X2 and X4, only the single sense amplifier which is connected to one bit line produces erroneous data. More specifically, for the defect X1 or X2, sense amplifier SA0 connected to bit line BL0 produces erroneous data; for the defect X4, sense amplifier SA1 connected to bit line BL1 produces erroneous data.

For the defect X3 as compared to the above, sense amplifiers SA1 and SA2 connected to the two bit lines BL1 and BL2 produce erroneous data.

For the case where redundant bit lines are used for the array having the above defects X1 to X4, the data from redundant array 9 may and should be read out only when the sense amplifier SA latching the erroneous data is selected by column decoder 10 to transfer the data to an unillustrated buffer. In this case, the sensing of other memory cells will not have any influence from the memory cells connected to the defective bit line, regardless of the fact that their thresholds are either in the low or high state.

As has been described, in the conventional semiconductor memory redundancy method, redundant replacement was used for defective bit lines. The description of the prior art example in Japanese Patent Publication No.2,600,435 and the description in Japanese Patent Application Laid-Open Hei 7 No.230,700, disclose that a defective node (of word line and bit line) is replaced with only the defective bit line (its source line).

In a virtual ground type flash memory, however, it is not possible to correct the defective array by replacing only the defective node with the node connected to one redundant memory cell.

Now, the bit line failure in the virtual ground type flash memory will be described. The defects in this case are as follows:

X1: Bit line open

X3: Short-circuit between bit lines

X4: Short-circuit between one bit line and the substrate.

Referring to FIGS. 5A to 7, explanation will be made on the problems occurring when correction to bit line defects in the virtual ground type flash memory is attempted by the redundancy method which has been used for correcting the bit line failure of a conventional NOR type array.

FIG. 5A shows a memory array configuration with a defect, and FIG. 5B shows the influences upon the readout data from memory cells M0 to M3 (change in bit line voltage and the readout data pass-fail state) when the memory array has a bit-line open defect at X1.

Suppose that bit-line open defect occurs at X1 on bit line BL2 and the data is read out from the memory cells connected to word line WL0.

First, when the data in memory cell M0 is read out, the voltage to be applied to each bit line is as follows: 1 V is applied to bit lines BL0, BL3, BL4, BL7 and BL8 and 0V is applied to bit lines BL1, BL2, BL5 and BL6. FIG. 5B shows this state. It is assumed that the thresholds of memory cells M0, M1 and M2 are in the low state (not greater than 1(V)) as shown in FIG. 2. Since potential of bit line BL2 is floating, the line cannot be retained at 0 V. The voltage applied to bit line BL3, i.e., 1 V, is applied to bit line BL2 via memory cell M2 having a low threshold and also applied to bit line BL1 so that the voltage of bit line BL1 rises greater than the unaffected voltage, i.e., 0 V. As a result, memory cell M0 is misjudged as a cell having a high threshold.

When the data in memory cell M1 is read out, the voltage applied to each bit line is as shown in FIG. 5B. In this case, since bit line BL2 is floating, the line cannot be driven at 0 V so that the data cannot be read.

When the data from memory cell M2 is read out, the sense node (BL2) is floating as understood from the voltage applied to each bit line shown in FIG. 5B, so that the data cannot be read.

When data in memory cell M3 is read out, the voltage applied to each bit line is as shown in FIG. 5B. When memory cell M2 has a low threshold state while memory cell M3 from which data is read out has a high threshold state, bit line BL2 cannot be driven at 1 V. Further, a voltage is applied from bit line BL3 to memory cell M2 having a low threshold, resultantly the voltage of bit line BL3 lowers. Consequently, the threshold of memory cell M3 is misjudged as being at a low level due to the voltage drop of bit line BL3, so that the data is misread.

As described above, in the case of a virtual ground type, only one bit line open causes the memory cells connected to the four bit lines to produce erroneous data. Therefore, the memory cells connected to the four bit lines need to be replaced.

Next, explanation will be made of a case where data is read out from memory cells connected to word line WL0 when a short-circuit (defect 'X3') occurs between bit lines BL3 and BL4 as shown in FIG. 6A. FIG. 6B shows the applied voltage state and readout data pass-fail state when each memory cell is read.

When the data from memory cell M0 is read out, this operation is unaffected since bit lines BL3 and BL4 are set at the same voltage, i.e., 1 V.

Secondly, when the data from memory cell M1 is read out, bit line BL3 is set at 0V and bit line BL4 is set at 1V. If it is assumed that the thresholds of the memory cells M1 and M2 are low, the potential of bit line BL3 rises since bit lines BL3 and BL4 are short-circuited. The potential of bit line BL2 also further raises, through memory cell M2 having a low threshold, more than the normal array state. As a result, the potential of bit line BL1 remains at the same level, so that memory cell M1 is misjudged as having a high threshold.

Next, when the data from memory cell M2 is read out, bit lines BL3 and BL4 are set at 0 V so that the data can be read out without any influence.

When the data from memory cell M3 is read out, since sense node (BL3) and the node (BL4) to which 0 V is applied are short-circuited the data cannot be read correctly.

When the data from memory cell M4 is read out, a case is considered where the thresholds of memory cells M2 and M3 are low and the threshold of memory cell M4 from which data is read is high. In this case, since sense node BL4 is short-circuited to bit line BL3, lowering at the node of bit line BL3 (the potential at the node lowers compared to that in a normal array) directly affects and lowers the potential at sense node BL4, resultantly the threshold of memory cell M4 is misjudged as being low, producing erroneous readout.

When the data from memory cell M5 is read out, bit lines BL3 and BL4 are set at 0 V and 1 V, respectively. When the threshold of memory cell M4 is low and the threshold of memory cell M5 from which data is read is high, the potential of bit line BL4 lowers and the potential of the node of bit line BL5 lowers compared to that of a normal array since bit lines BL3 and BL4 are short-circuited. Resultantly the threshold of memory cell M5 is misjudged as being low, producing erroneous readout again, in this case.

Readout from memory cells M6 and M7 will not be affected by this reading method and hence can be performed normally.

Next, explanation will be made of a case where data is read out from memory cells connected to word line WL0 when a short-circuit (defect 'X4') occurs between bit line BL2 and the substrate as shown in FIG. 7A. FIG. 7B shows the applied voltage states and the readout data pass-fail state when each memory cell is read. In this case, there are two patterns which disable normal readout. One is the case where data is read from memory cell M2. In this case, since sense node (BL2) is short-circuited to the substrate, normal readout can not be performed.

The other case occurs when, upon the readout from memory cell M3, the threshold of memory cell M2 is low and the threshold of memory cell M3 from which data is read is high. In this case, since bit line BL2 and the substrate are short-circuited, the potential of bit line BL2 lowers, further reducing the potential of bit line BL3 via memory cell M3 having a low threshold. Resultantly, the cell is misjudged as being low, producing erroneous readout.

As has been described, when a defect occurs in bit lines in a virtual ground type flash memory, the defect affects the readout from memory cells which are not connected to the defective bit lines. Therefore, only having redundant replacement of the defective bit lines is not good enough, rather a number of bit lines need to be replaced.

SUMMARY OF THE INVENTION

The present invention has been devised in order to solve the above problems, and it is therefore an object of the present invention to provide a method and device for efficiently compensating a virtual ground type flash memory with a redundant arrangement.

In order to achieve the above object, the present invention is configured as follows:

In accordance with the first aspect of the invention, in a redundancy method for a non-volatile semiconductor memory of a virtual ground type wherein the non-volatile virtual ground type semiconductor memory comprises:

a number of electrically programmable and erasable floating gate field effect transistors each having a control gate, a drain and a source, arranged matrix-wise in rows and columns forming an array, so that the control gates of the floating gate field effect transistors constituting each row are connected with one row line and the drains or sources of the floating gate field effect transistors constituting each column are connected with one column line, the method includes the steps of:

providing one or more column lines for redundancy, with which floating gate field effect transistors at least in the same number as that of the row lines of the array are connected;

when a defect occurs in a column line, setting the thresholds of at least all the floating gate field effect transistors connected to the defective column line, at a high state; and using as the substitute memory, the floating gate field effect transistors for redundancy connected to redundancy column lines in a number as many as those of the floating gate field effect transistors of which the thresholds are set at the high state.

In accordance with the second aspect of the invention, in a redundancy method for a non-volatile semiconductor memory of a virtual ground type wherein the non-volatile virtual ground type semiconductor memory comprises:

a number of floating gate field effect transistors which each include a control gate having a control gate layer, an inter-layer insulating film and a floating gate, a drain and a source and are electrically programmable and erasable by injecting electrons into, or drawing electrons from, the floating gate by using the FN tunnel effect, and are arranged matrix-wise in rows and columns forming an array, so that the control gates of the floating gate field effect transistors constituting each row are connected with one row line and the drains or sources of the floating gate field effect transistors constituting each column are connected with one column line, the method includes the steps of:

providing one or more column lines for redundancy, with which floating gate field effect transistors at least in the same number as that of the row lines of the array are connected;

when a defect occurs in a column line, setting the thresholds of at least all the floating gate field effect transistors connected to the defective column line, at a high state;

using as the substitute memory, the floating gate field effect transistors for redundancy connected to redundancy column lines in a number as many as those of the floating gate field effect transistors of which the thresholds are set at the high state; and outputting a programming or erasing voltage to the floating gate field effect transistors for redundancy when the data is programmed or erased.

In accordance with the third aspect of the invention, the redundancy method for a non-volatile semiconductor memory having the first or second aspect is characterized in that when the defect occurring in the column line is a column line open, the thresholds of at least two columns of floating gate field effect transistors connected to the defective column line are set at the high state.

In accordance with the fourth aspect of the invention, the redundancy method for a non-volatile semiconductor memory having the first or second aspect is characterized in that when the defect occurring in the column line is a short-circuit between adjoining two column lines, the thresholds of at least three columns of floating gate field effect transistors connected to the defective column lines are set at the high state.

In accordance with the fifth aspect of the invention, the redundancy method for a non-volatile semiconductor memory having the first or second aspect is characterized in that when the defect occurring in the column line is a short-circuit between one column line and the substrate, the thresholds of the floating gate field effect transistors of which the drain is connected to the column line are set at the high state.

In accordance with the sixth aspect of the invention, a redundancy device for a non-volatile semiconductor memory, includes:

a non-volatile semiconductor memory having a virtual ground type array of a number of floating gate field effect transistors which each include a control gate having a control gate layer, an inter-layer insulating film and a floating gate, a drain and a source, are electrically programmable and erasable by injecting electrons into, or drawing electrons from, the floating gate by using the FN tunnel effect, and are arranged matrix-wise in rows and columns, wherein the control gates of the floating gate field effect transistors constituting each row are connected with one row line and the drains or sources of the floating gate field effect transistors constituting each column are connected with one column line;

a memory for redundancy having the floating gate field effect transistors connected to one redundancy column line or lines in a number at least equal to the number of the rows of the array;

a means for raising the threshold levels of the floating gate field effect transistors connected to one column line or more; and a means for enabling the floating gate field effect transistors connected to the redundancy column line or lines to be used for memory.

Hereinafter field effect transistor is also referred to as "FET".

In accordance with the first and second aspect, it is possible to minimize the influences of a defective column line in a non-volatile semiconductor memory of a virtual ground type array, by setting the thresholds of at least one column of floating gate FETs connected to the defective column line, into the high state. From this result, it becomes possible to minimize the number of floating gate FETs for redundancy connected to redundancy column lines to replace the floating gate FETs connected to the defective column line.

In accordance with the third aspect, if a column line open defect occurs in a non-volatile semiconductor memory of a virtual ground type array, the backup or redundant replacement can be effected by setting the thresholds of at least two columns of floating gate FETs connected to the defective column line into the high state while putting the same number of floating gate FETs for redundancy into operation. As a result, it is possible to compensate the defect by providing a lower number of columns of floating gate FETs for redundancy than that of the columns of floating gate FETs for redundancy, required when the columns of floating gate FETs affected by the column line open defect were compensated in a simple manner by the redundant arrangement.

In accordance with the fourth aspect, if a short-circuit defect between column lines occurs in a non-volatile semiconductor memory of a virtual ground type array, the backup or redundant replacement can be effected by setting the thresholds of at least three columns of floating gate FETs connected to the defective column into the high state, while putting the same number of floating gate FETs for redundancy into operation. As a result, it is possible to compensate the defect by providing a lower number of the columns of floating gate FETs for redundancy than that of columns of floating gate FETs for redundancy required when the columns of floating gate FETs affected by the short-circuit between column lines were compensated in a simple manner by the redundant arrangement.

In accordance with the fifth aspect, if a short-circuit defect between one column line and the substrate occurs in a non-volatile semiconductor memory of a virtual ground type array, the backup or redundant replacement can be effected by setting the thresholds of at least one column of floating gate FETs connected to the defective column into the high state, while putting the same number of floating gate FETs for redundancy into operation. As a result, it is possible to compensate the defect by providing a lower number of columns of floating gate FETs for redundancy than that of the columns of floating gate FETs for redundancy required when the columns of floating gate FETs affected by the short-circuit between one column line and the substrate were compensated in a simple manner by the redundant arrangement.

In accordance with the sixth aspect, a means for raising the threshold levels of the floating gate FETs connected to the column lines is provided in a redundancy device for a non-volatile semiconductor memory having a virtual ground type array with redundant memory. Accordingly, if a defect occurs in the column lines, it is possible to minimize the number of columns of floating gate FETs affected by the defects, thus making it possible to minimize the number of columns of floating gate FETs for redundancy.

DESCRIPTION OF THE PREFERRED EMBODIMENTS

Figure 1:
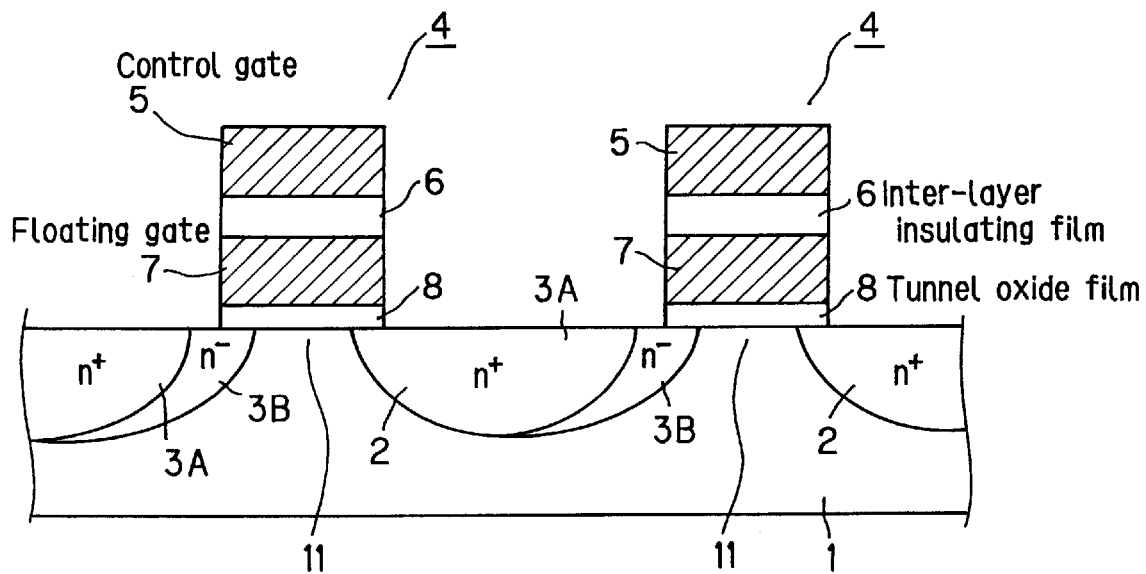
FIG. 1 is a sectional view showing an ACT type flash memory.

The embodiments of the invention will hereinafter be described in detail with reference to the accompanying drawings. In the following description, the same components as in the conventional configuration stated above are allotted with the same reference numerals and the description will not be repeated.

(The First Embodiment)

The first embodiment will be explained using a virtual ground type flash memory shown in FIG. 1.

Figure 2:
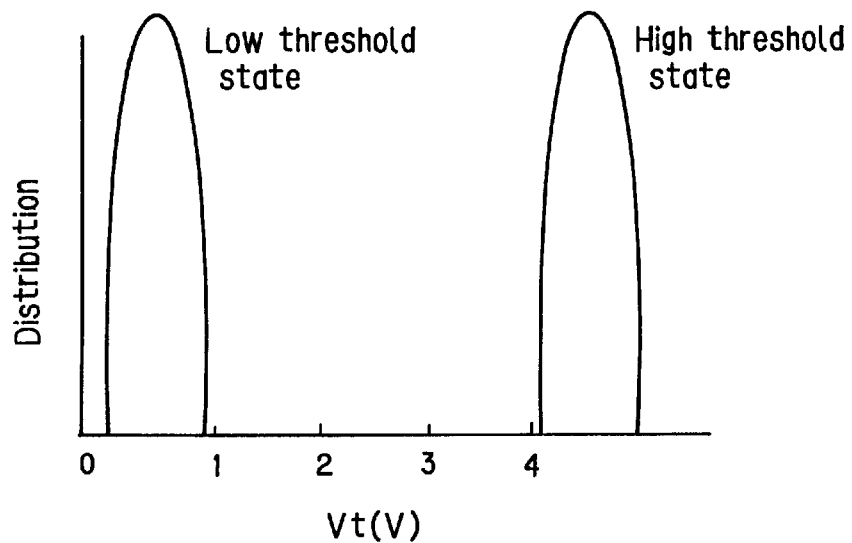
FIG. 2 is an illustrative chart showing the threshold voltages of an ACT type flash memory.
Figure 3:
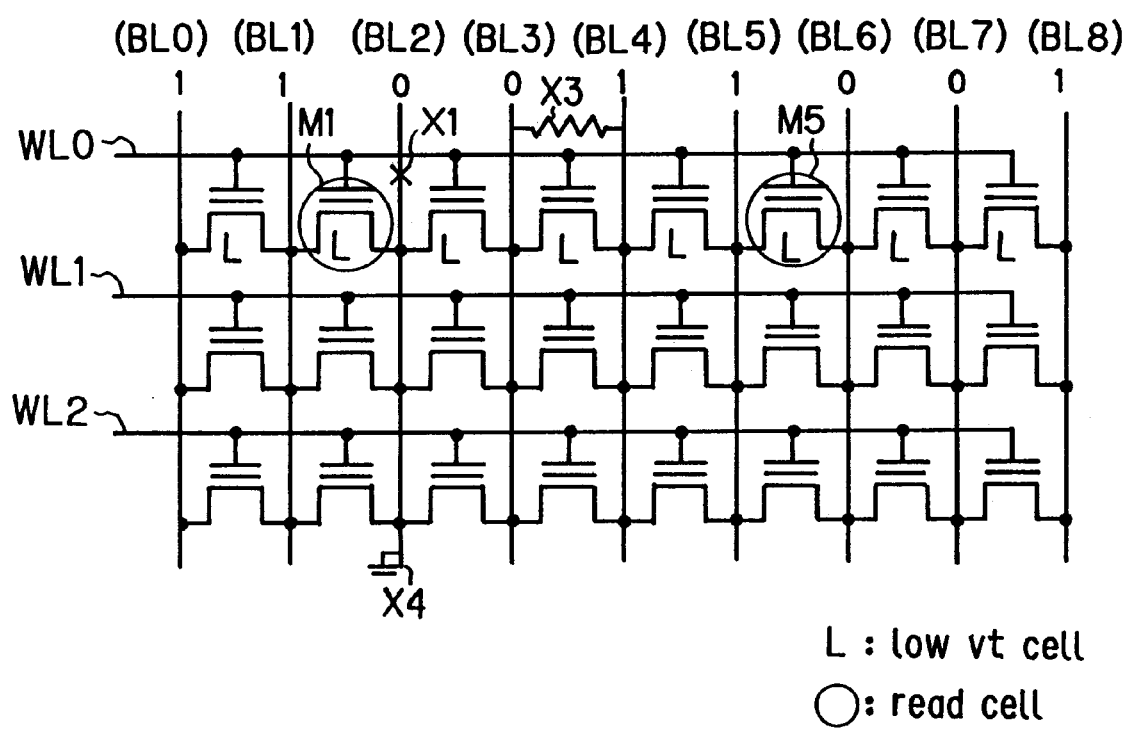
FIG. 3 is an illustrative diagram for explaining defects and processing cycles of a virtual ground memory array.
Figure 4:
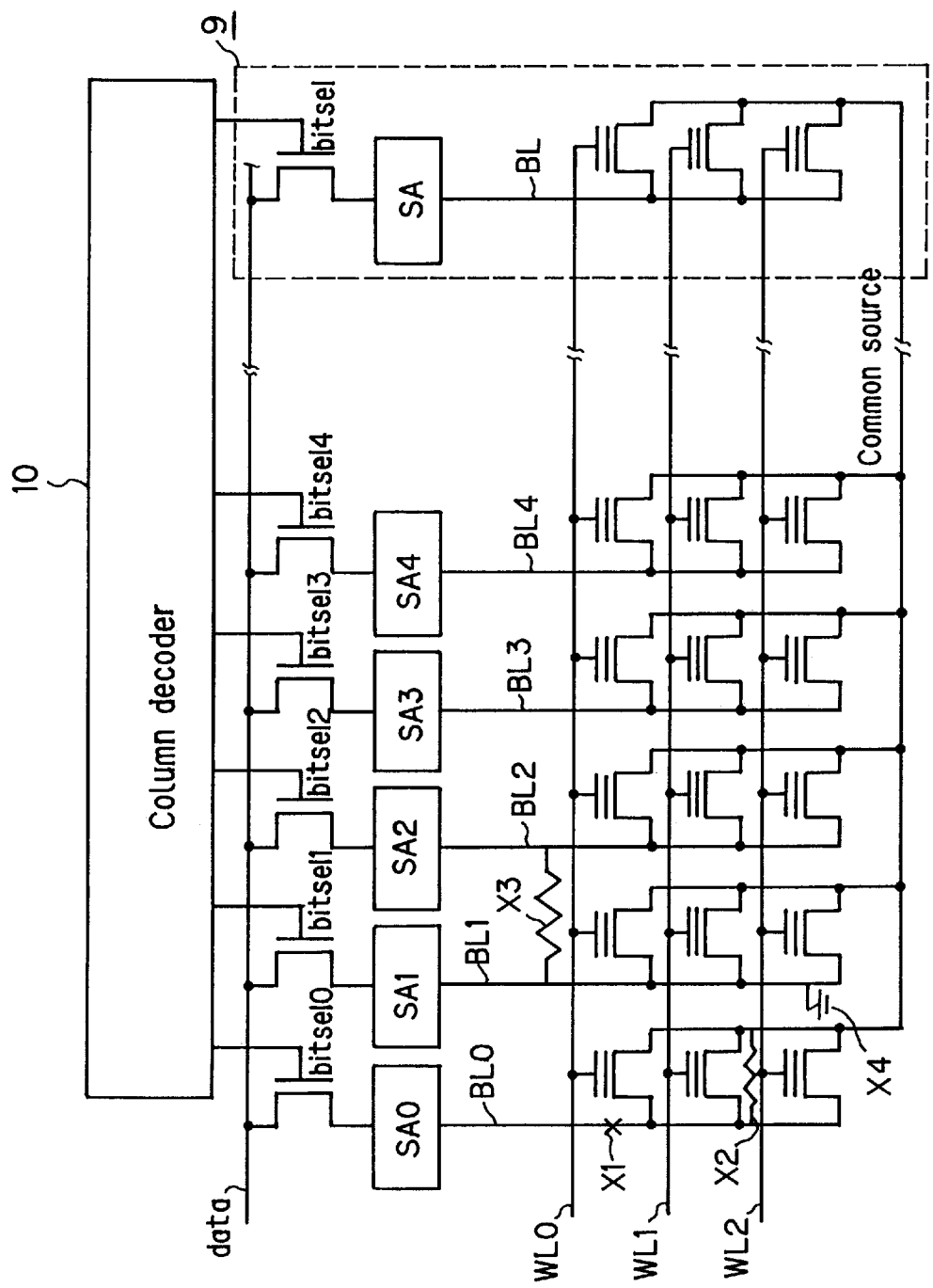
FIG. 4 is a circuit diagram showing part of a NOR type flash memory array.

As already stated, the cell has a basic configuration having a field effect transistor with a floating gate 7. This cell, designated at 4, is featured such that the donor density directly below floating gate 7 differs between the drain 2 side and the source 3 side. Table 1 shows the modes of operation of cell 4 having the thresholds shown in FIG. 2.

TABLE 1

|  | Control gate | Drain | Source | P-type well |
|---|---|---|---|---|
| Program | −8 V | 4 V/* | 4 V/* | 0 V |
| Erase | 10 V | −8 V | −8 V | −8 V |
| Read | 3 V | 1 V | 0 V | 0 V |

The voltage * is open or +1 V.

Programming of the ACT type flash memory is performed with a negative voltage (e.g., −8 V) applied to control gate 5, a positive voltage (e.g., 4 V) to drain 2 and a positive voltage (e.g., 4 V), or open or 1V applied to source 3. Under these conditions, the FN tunnel effect occurs on the drain 2 side to lower the threshold. This cell is basically insensitive to the voltage application to the source 3 side so that it cannot be programmed with 4 V.

Similarly, an erase operation is performed with a negative voltage (e.g., −8 V) applied to drain 2, source 3 and p-type well 1 and a positive voltage (e.g., 10 V) applied to control gate 7. By these settings, electrons are injected into floating gate 7 from a channel layer 11 to make the threshold high (see FIG. 2).

A reading operation of data is performed based on the current flowing through cell 4 with 1 V applied to drain 2 and 0 V applied to source 3. The detail of the structure and principle of the operation is shown in the aforementioned documents 'A New Cell Structure for Sub-quarter Micron High Density Flash memory' (IEDM Technical Digest, pp.269–270, 1995), and 'An investigation of a sensing method of an ACT type flash memory' (ICD97–21, p37, 1997, Technical Report of the Institute of Electronics Information and Communication Engineers). A detailed description is not essential here, so no further description will be made.

Figure 8:
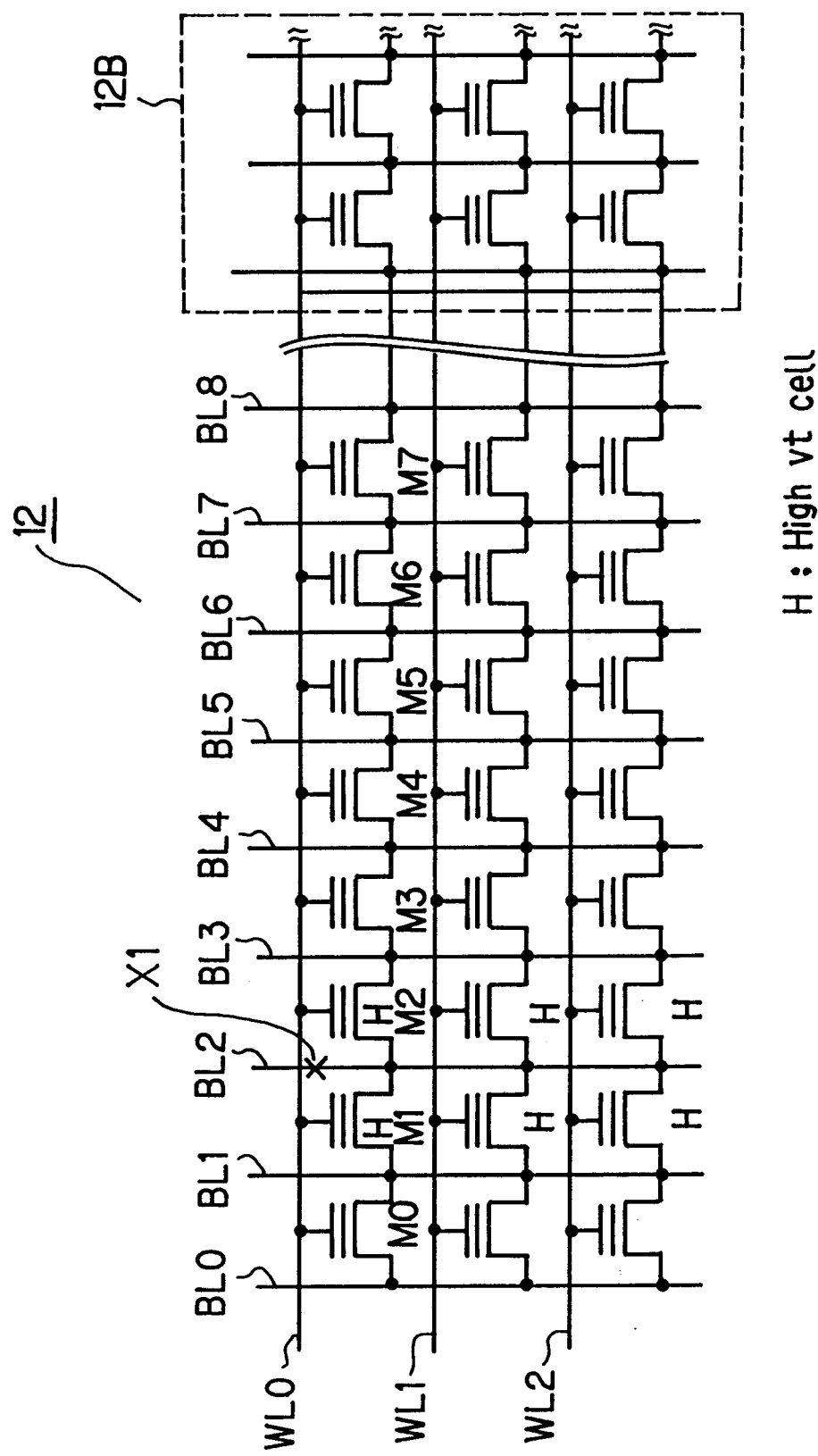
FIG. 8 is an illustrative diagram showing a bit line open defect in a virtual ground memory array in accordance with the first embodiment of the invention.

FIG. 8 shows a memory array 12 for attaining the present invention.

In FIG. 8, cells 4 shown in FIG. 1 are arranged matrix-wise, i.e., in rows and columns, forming a memory array 12. In this arrangement, the control gates of individual floating gate FETs constituting a column are connected to row lines (word lines) WL0, WL1 and WL2 while drains 2 or sources 3 of individual floating gate FETs constituting a column are connected to column lines (bit lines) BL0 through BL8, thus forming a virtual ground type array 12.

This arrangement further has a redundant array 12B which has floating gate FETs, connected to redundant replacement column lines, at least in the same number as that of row lines of array 12.

Figure 9:
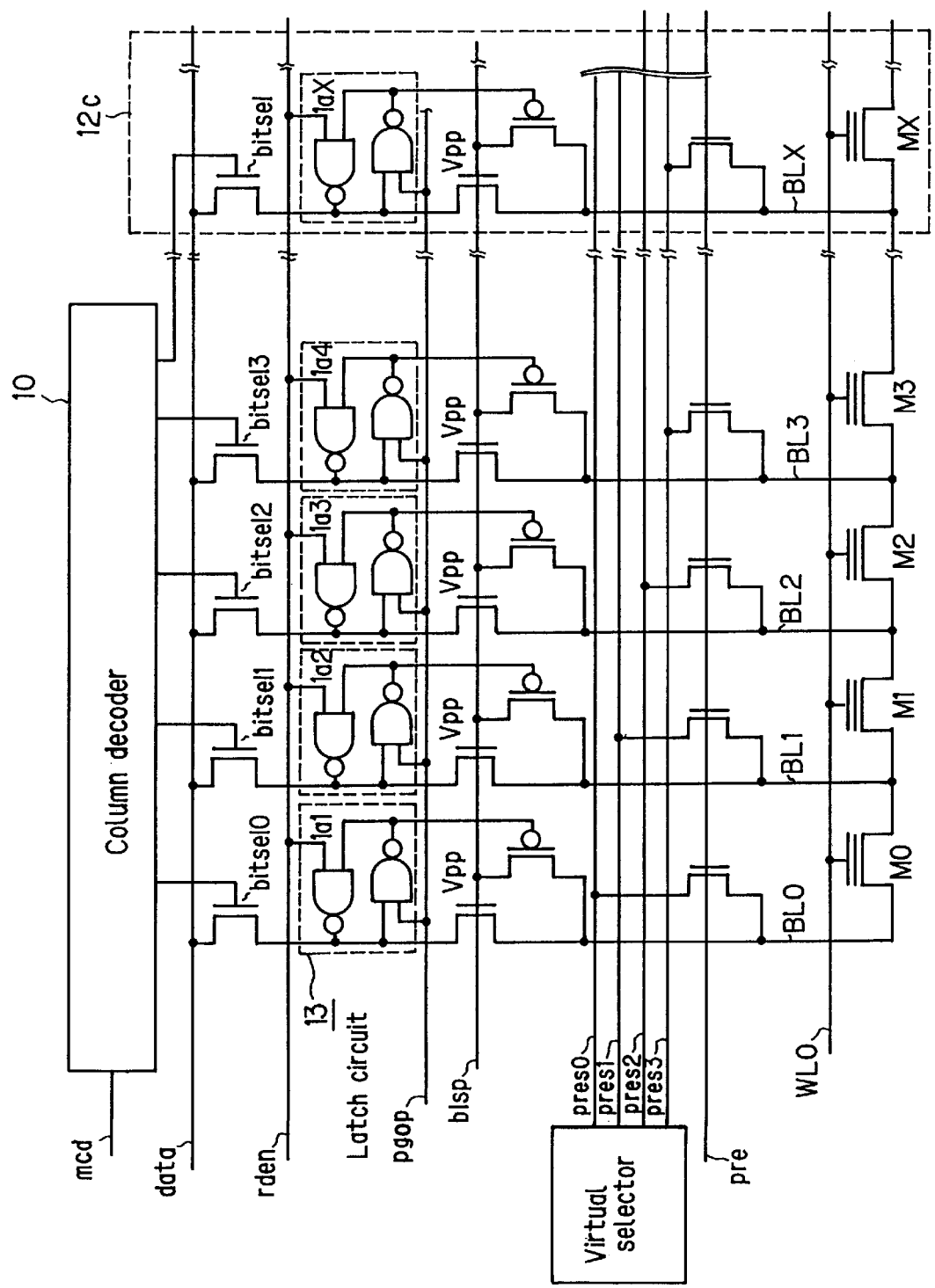
FIG. 9 is a circuit diagram showing part of a virtual ground memory array in accordance with the first embodiment of the invention.

FIG. 9 shows a circuit diagram for attaining the present invention. First, description of the operation of this circuit will make in a case where the circuit has no failure bits and hence the redundant array circuit designated at 12C is not used.

When a cell 4 is programmed, a signal 'pgop' is set at a low level and a signal 'rden' is set at a high level so that the data of all the latch circuits 13 is set to the low state. In this situation, a signal 'blsp' becomes set at a lowlevel. Subsequently, signal 'pgop' is set at a high level. Thereafter, when data is input from a signal 'data', the data is transferred from cells bitsel0, bitsel1, bitsel2 and bitsel3 to latch circuits la1, la2, la3 and la4, in this order. For example, when the programming data to memory cell M0 is "1", signal 'data' is at a high level, so that cell 'bitsel0' is set high and hence latch circuit la1 latches the high state.

When the programming data to memory cell M1 is "0", signal 'data' is at the low level, so that cell 'bitsel1' is set high and hence latch circuit la2 latches the low state. Thus the data is transferred.

The program pulse is applied by a signal vpp of a specified programming voltage, e.g., 4 V, with 4 V applied to bit line BL0 and bit line BL1 open. As a result, memory cell M0 is programmed, lowering its threshold while memory cell M1 is prohibited from being programmed keeping its threshold high.

Data reading is carried out by a four cycle reading operation as stated above. A read operation is done by resetting latch circuit 13 with signal 'pgop' at the high state, signal 'rden' at the low state; after the completion of resetting, setting the signal 'rden' to the high state; setting a signal 'pre' to a high level to pre-charge the bit line BL of the cell 4 to be read. At this point, signal 'blsp' is at about 2 V.

When memory cell M0 is read, signals 'pres0' and 'pres3' are set at 1 V and signals 'pres1' and 'pres2' are set at 0 V, bit line BL0 becomes pre-charged at 1 V. When pre-charge is over, the signal 'pre' becomes set at a low state. If memory cell M0 has a low threshold, electric charge is discharged through memory cell M0, the potential of bit line BL0 and the sense node lowers hence the low level state will be latched. In contrast, when memory cell M0 has a high threshold, the potential of bit line BL0 and the sense node will not lower hence the high level state will be latched.

The conditions of voltage application of the signals 'pres' for reading of memory cells M0, M1, M2 and M3 are summarized in Table 2.

TABLE 2

|    | pres0 | pres1 | pres2 | pres3 |
|----|-------|-------|-------|-------|
| M0 | 1 V   | 0 V   | 0 V   | 1 V   |
| M1 | 1 V   | 1 V   | 0 V   | 0 V   |
| M2 | 0 V   | 1 V   | 1 V   | 0 V   |
| M3 | 0 V   | 0 V   | 1 V   | 1 V   |

When the specified voltages shown in Table 2 are applied to appropriate 'pres' lines, the data from each memory cell is latched by the corresponding sense circuit (latch circuit 13). The data sequentially sets cells 'bitsel0', 'bitsel1', 'bitsel2' and 'bitsel3', to high levels, and is output to an unillustrated buffer.

Next, an erase operation of memory cells 4 is carried out by setting all the word lines WL within the block at a positive high voltage (e.g., 10 V) and applying a negative voltage (e.g., −8 V) to bit lines BL and substrate 1 so as to raise the thresholds of all the memory cells 4 within the block to the high state.

Next, the operation of this array 12 will be explained when a redundant array circuit 12C is used.

As shown in FIG. 8, when bit line BL2 has an open defect at X1, all the cells in array 12 are erased or set into the high threshold state. The erase operation is carried out block-wise, specifically by applying a positive voltage (e.g., 10 V) to all the word lines WL0 to WL2 in FIG. 1 and applying a negative voltage (e.g., −8 V) to all the bit lines BL0 to BL8 and substrate 1.

Here, since a negative voltage is applied to bit lines BL1 and BL3 even when the bit line becomes open at X1 in FIG. 8, bit line BL2 is also supplied by the negative voltage through the adjacent memory cells M1, M2 and others. Therefore, all the memory cells connected to bit line BL2 can be erased. Here, during program and read operations, the memory cells connected to bit lines BL1 and BL2 are kept at the high state as shown in FIG. 8. By this manipulation, it is possible to handle only the memory cells connected to bit lines BL1 and BL2 as the defective cells.

As stated above, when the thresholds of memory cells M1, M2 and others connected to bit lines BL1 and BL2 are left in the high state, it becomes possible to normally read the data from the memory cells such as M0.

In this case, the data in memory cells M1, M2 etc., are stored for backup in redundant circuit 12C.

Figures 5A, 5B:
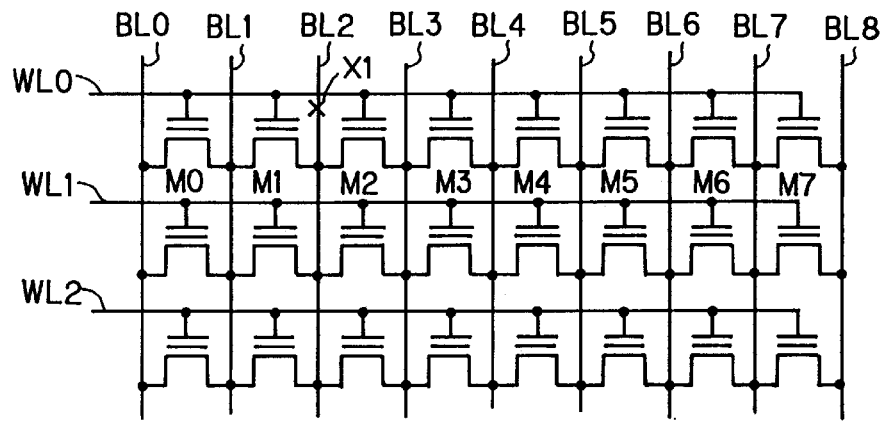
FIGS. 5A and 5B are illustrative diagrams for explaining influences upon cells when a bit line open defect occurs in an ACT type flash memory array.
Figures 6A, 6B:
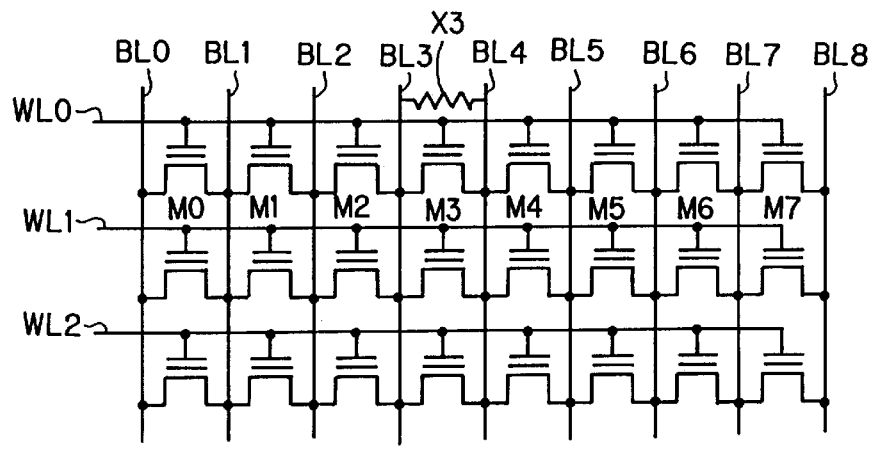
FIGS. 6A and 6B are illustrative diagrams for explaining influences upon cells when a short-circuit defect occurs between bit lines in an ACT type flash memory array.

Upon reading memory cell M0, the influence from the bit line potential of bit line BL3, mentioned referring to FIG. 5B, will not appear and hence the potential of bit line BL1 will not rise because the threshold of memory cell M1 is in the high state. Therefore, memory cell M0 can be sensed to produce correct data. Upon reading memory cell M3, since the threshold of memory cell M2 is in the high state, the potential of bit line BL3 will not lower and hence the correct data can be sensed from memory cell M3.

Thus, when a bit line open defect (X1) occurs, it is possible to reduce the number of bit lines required for redundant replacement to a half of that required when redundant circuit 12C is used in a simple manner without setting the thresholds of memory cells 4 connected to the defective bit line at the high state.

Figure 10:
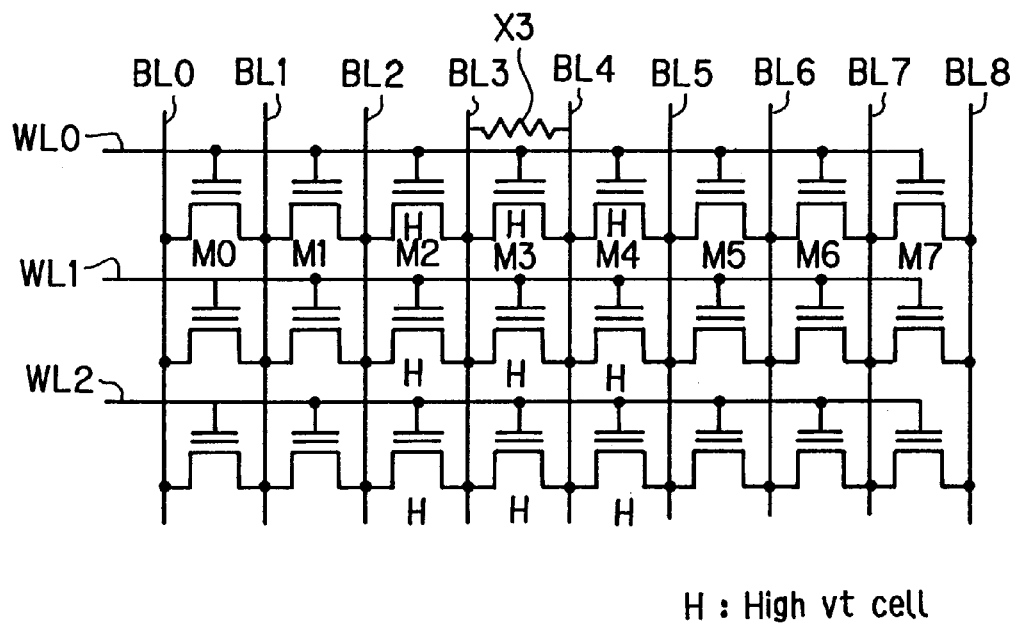
FIG. 10 is an illustrative diagram showing a short-circuit defect between bit lines in a virtual ground memory array in accordance with the first embodiment of the invention.

Referring next to FIG. 10, description will be made of the case where a short-circuit defect X3 occurs between bit lines BL3 and BL4. In this case, as shown in FIG. 10, when the thresholds of the memory cells connected to bit lines BL2, BL3 and BL4 are set at the high state, the potential rise of bit line BL2 through memory cell M2 can be prevented, hence permitting reading from memory cell M1.

Since bit lines BL3 and BL4 are short-circuited, a negative voltage is applied to bit lines BL3 and BL4 during erasing, it is possible to erase the memory cells connected to bit lines BL2, BL3 and BL4 and raise the thresholds to the high state. In this case, the memory cells connected to three bit lines BL2, BL3 and BL4 are still defective while other memory cells can be read normally without being affected by the defect X3.

As explained in the above, in the case of short-circuit defect X3 between bit lines three bit lines (BL2, BL3 and BL4) need to be replaced with redundant ones. On the other hand, in the conventional configuration, when redundant circuit 12B was used in a simple manner without setting the thresholds of the memory cells at the high state, four bit lines BL1, BL3, BL4 and BL5 needed to be replaced. So, this configuration can reduce the number of redundant bit lines by one.

Figures 7A, 7B:
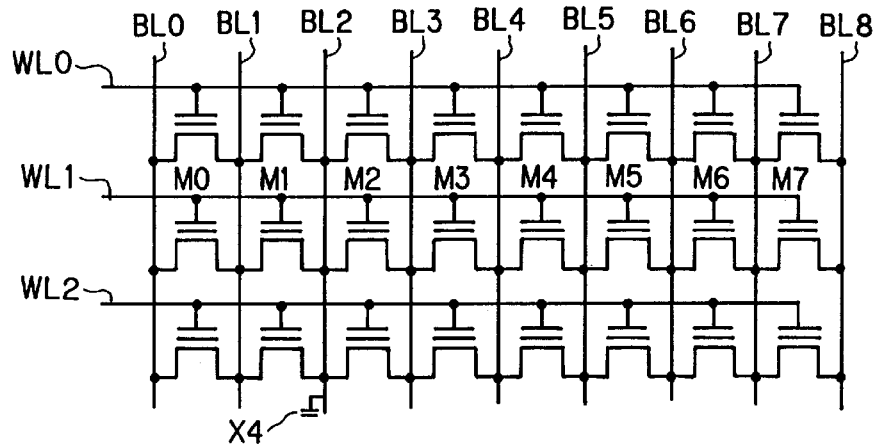
FIGS. 7A and 7B are illustrative diagrams for explaining influences upon cells when a short-circuit defect occurs between one bit line and the substrate in an ACT type flash memory array.
Figure 11:
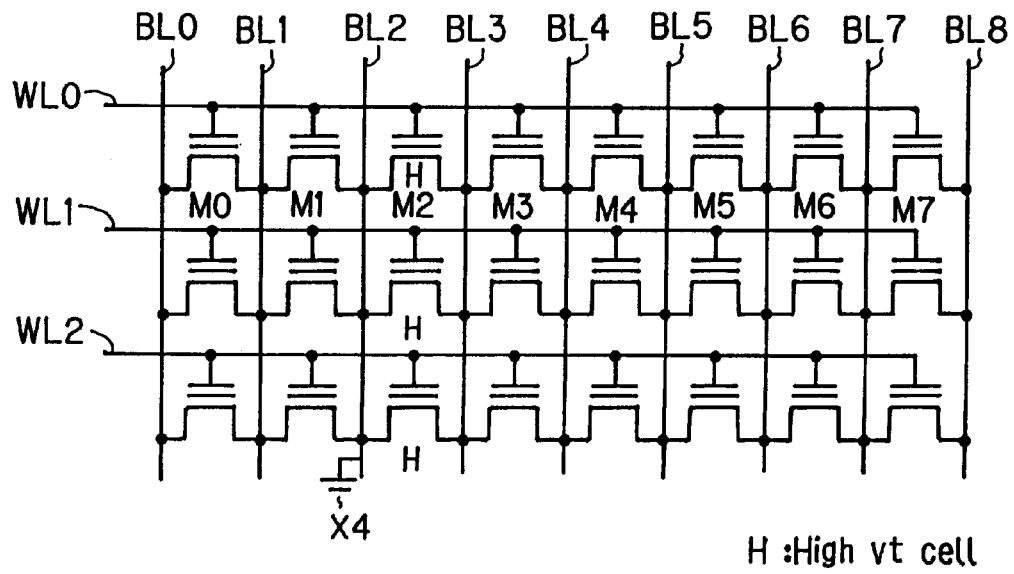
FIG. 11 is an illustrative diagram showing a short-circuit defect between one bit line and the substrate in a virtual ground memory array in accordance with the first embodiment of the invention.

Referring next to FIG. 11, description will be made of the case where a short-circuit defect X4 occurs between bit line BL2 and the substrate. In FIG. 11, the thresholds of the memory cells connected to bit line BL2 are kept in the high state so as to avoid the voltage drop of bit line BL3 for reading of memory cell M3 (shown in FIG. 7). Thus, only the one bit line (BL2) needs to be replaced by the redundant arrangement. On the other hand, in the conventional configuration, when redundant circuit 12B was used in a simple manner without setting the thresholds of the memory cells at the high state, two bit lines BL2 and BL3 needed to be replaced. So, this configuration can reduce the number of redundant bit lines by one.

Referring next to FIG. 9, description will be made of a means for keeping the threshold of memory cells 4 connected to one defective bit line at the high state.

As already stated, an erase operation is done block-wise so that the thresholds of all the cells can be set at the high state by the erase operation even if the block contains some bit line defects. When programming needs to be performed with the thresholds being in the high state, more specifically, when a bit line open defect X1 occurs in bit line BL2, it is necessary to leave the memory cells connected to bit lines BL1 and BL2 in the high state.

The programming operation will be explained hereinbelow. Upon programming, first, signals 'pgop' and 'rden' are set at the high state while signals 'blsp' and 'pre' are set at the low state. These settings reset data latch circuit 13 and keeps the signal 'pgop' in the-high state.

Next, data signal is transferred. In this example, cell 'bitsel0' becomes set at the high state so that the data is transferred to latch circuit la1. On the other hand, since bit lines BL1 and BL2 are replaced by the redundant arrangement, a mcd signal of the high state is output from an unillustrated matching circuit so that bitsel1 and bitsel2 are kept in the low state. At the same time, the cells 'bitsel', corresponding to cells bitsel1 and bitsel2, in redundant circuit 12C, become set at the high state, the data is transferred to these cells.

Next, returning to the normal operation, cell 'bitsel3' becomes set at the high state so that the data is latched by latch circuit la4.

By the above described operation, latch circuits la1 and la2 latch the low level of data. When a program pulse is applied, a program prohibiting voltage is output to bit lines BL1 and BL2 to thereby maintain the thresholds of memory cells M1 and M2 in the high state. Further, definite output of the program prohibiting voltage to bit lines BL1 and BL2 contributes to reducing the power consumption.

In this way, the number of memory cells causing misreading can be reduced by setting the thresholds of the memory cells adjoining a defective bit line into the high state. Resultantly, it is possible to reduce the number of bit lines required for redundancy of virtual ground array 12, and hence reduce the layout area as well as the power consumption of the array.

(The second embodiment)

Figure 12:
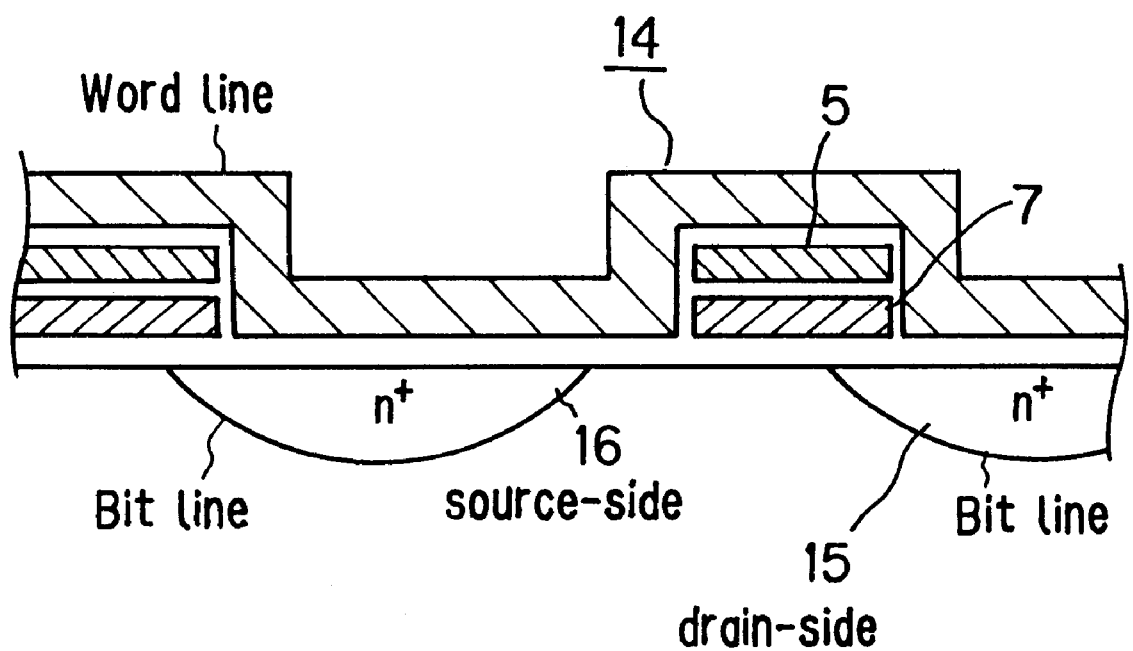
FIG. 12 is a sectional view showing a flash memory in accordance with the second embodiment of the invention.

FIG. 12 shows a memory cell configuration used in the second embodiment. A flash memory 14 shown in FIG. 12 is a flash memory of split gate type. This is found in, for example, 'A 5V-only 16M flash memory using a contactless array of source-side injection cells' (1995 Symposium on VLSI circuits Digest of Technical Papers, p78). Table 3 shows application of voltages to cell 14 when it is used for multi-bit writing.

TABLE 3

|  | Control gate | Word line | Source | Drain |
| --- | --- | --- | --- | --- |
| Program | 12 V | 2 V | 5 V | 0 V |
| Erase | −12 V | 0 V | 0 V | 5 V |
| Read | 5 V | 5 V | 1 V | 0 V |

During programming, the voltages shown in Table 3 are applied to the appropriate terminals. Under these conditions, hot electrons arise on a source side 16 shown in FIG. 12, and the electrons are injected into a floating gate 7 to raise the threshold.

During erasing, the FN tunnel effect occurs on a drain side 15 to draw electrons from floating gate 7. Data reading is carried out by applying 1 V to source side 16.

Figure 13:
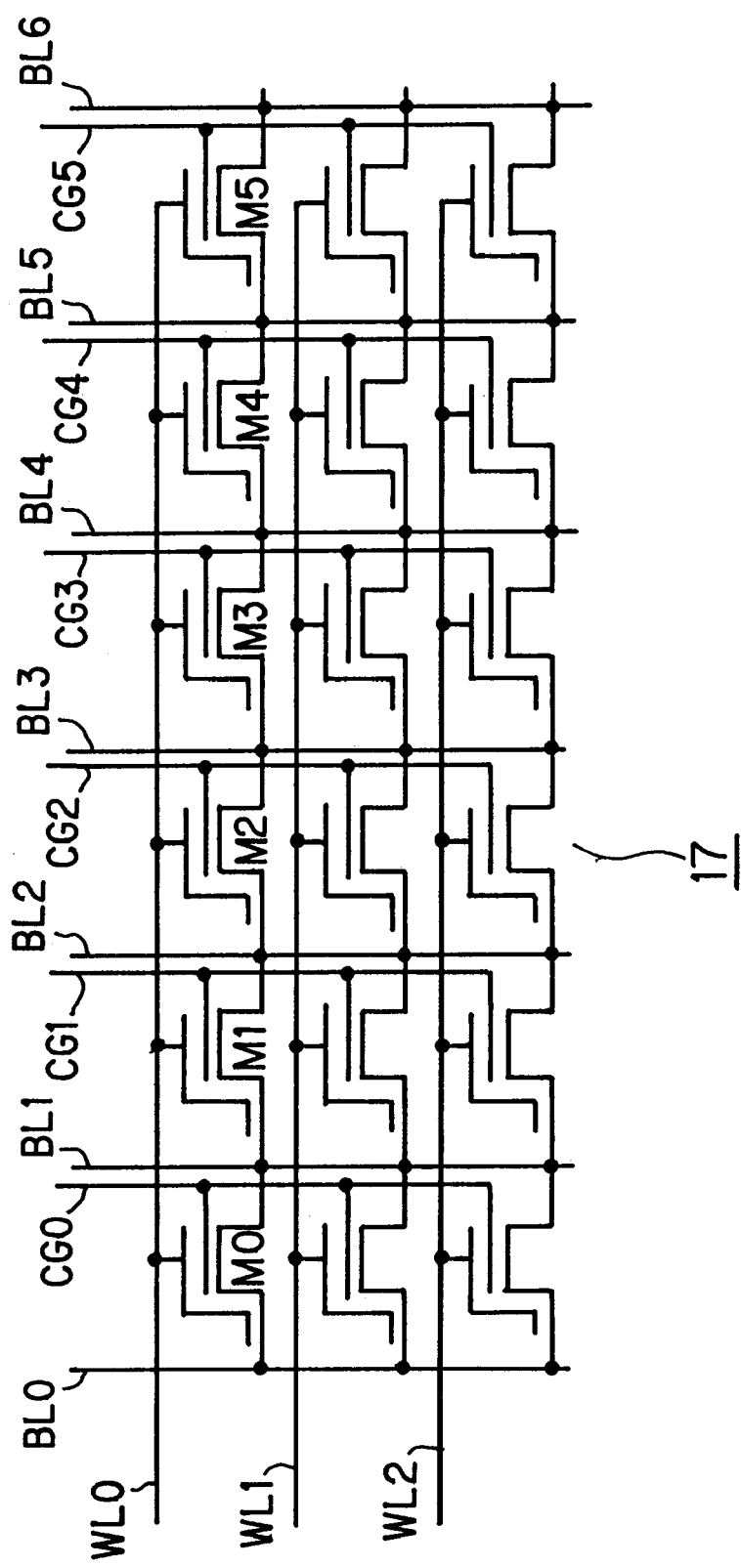
FIG. 13 is an illustrative diagram showing a virtual ground memory array in accordance with the second embodiment of the invention.
Figure 14:
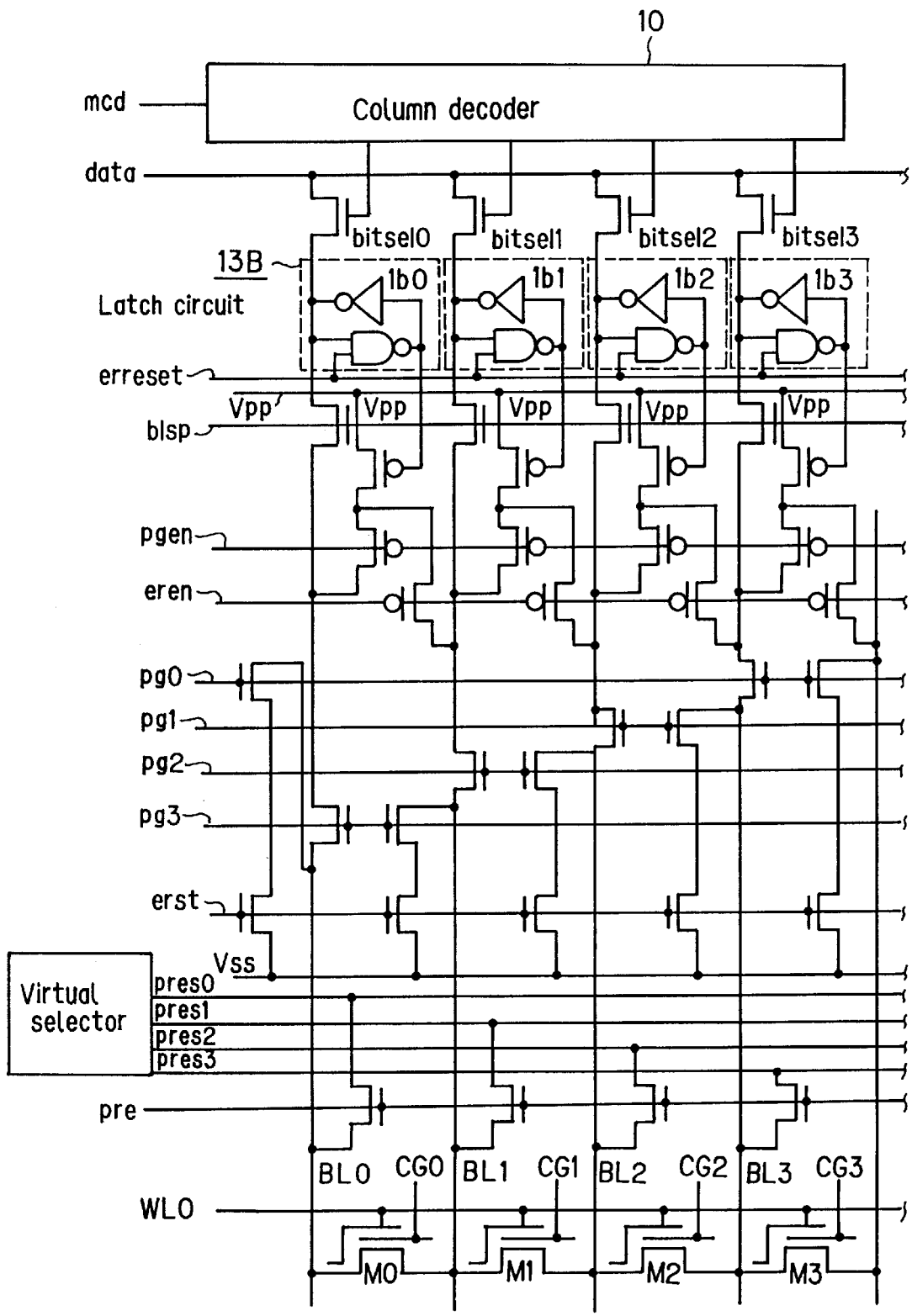
FIG. 14 is a circuit diagram showing part of a virtual ground memory array in accordance with the second embodiment of the invention.

FIG. 13 shows an array 17 of flash memory 14. In this case, source side 16 of memory cell M0 is connected to bit line BL0. The array configuration is a virtual ground type. FIG. 14 shows the column control circuit for this array.

The operation of the circuit shown in FIG. 14 will be described when no redundancy is used. First, data is transferred to a latch circuit lb1. This is the same scheme used in the first embodiment. At this time, a signal 'erreset' is set at the high state, a signal 'blsp' is set at the low state, a signal 'pgen' is set at the low state, and a signal 'eren' is set at the program voltage level (e.g., 5 V).

Next, a signal Vpp is raised to program voltage level (e.g., 5 V) and then a signal pg3 is raised to the program voltage level pulse Vth (the threshold of the n-MOS transistor). Under these conditions, if the high state has been latched by latch circuit lb0 and cell M0 needs to be programmed, 5 V is output to bit line BL0. At this time, bit line BL1 is set at 0V and control gate CG0 and the word line WL0 are set at 12 V and 2 V, respectively, so that a current flows through memory cell M0 to generate hot electrons on source side 16 thus raising the threshold of memory cell M0.

When the low state has been latched by latch circuit lb0 and programming is prohibited, no current flows through the memory cell and hence the threshold remains in the low state.

As programming of memory cell M0 is completed, signal pg3 becomes set at the low state in the next cycle, and a signal pg2 is set at the high state to carry out the programming of memory cell M1. Then, memory cells M2 and M3 are programmed sequentially, in this order. The programming of all the cells is effected by four cycles of the above operation. Because the program current required for one cell is 20 μA when source-side injection is used, which is relatively large, one cycle of the operation can write up to about 512 cells (in this case, the program current amounts to about 10 mA).

Erasing of this memory is effected by setting signal 'pgen' at the erase voltage level (e.g., 5 V) with signal 'errest' in the low state, signal 'blsp' in the low state and signal 'eren' in the low state. Next, signal 'data' is set into the high state and then cell 'bitsel' is set at the high level, which is latched by the latch circuit.

After the above, signals pg3, pg2, pg1 and pg0 are set at the erase voltage level plus Vth so as to make each bit line conductive and to be applied at 5 V. As a result, electrons are drawn from drain side 15 (FIG. 12) of each memory cell so that the threshold thereof is lowered. Reading method is basically the same as that shown in the first embodiment.

Next, description will be made of a case where some bit line defects exit in array 17 and redundant replacement is used. Suppose, for example, memory cell M0 has data '0' (program), memory cell M1 has data '1' (program disabled) and bit line BL2 is open. In this case, the thresholds of memory cells M1 and M2 and the cells connected to BL1 and BL2 are all set at the high state and these cells are replaced by the memory cells in the redundant bit line arrangement.

First, signal 'data' is transferred to a latch circuit 13B. In this case, the data line is set at a high level and cell 'bitsel0' is set at a high level. Under these conditions, latch circuit lb0 latches the high level state.

Next, since bit line BL1 has been replaced by the redundant arrangement, an unillustrated matching circuit performs a matching operation while a signal 'mcd' is set at a high level and column decoder 10 becomes disabled and cell 'bitsel1' becomes set at the low state.

At the same time, the appropriate cell 'bitsel' is selected by an unillustrated decoder so that a corresponding latch circuit lb latches the data. The same operation is carried out again in the case of bit line BL2 to be replaced by the redundant arrangement. On the other hand, bit line BL3 is not replaced by the redundant arrangement and the data is transferred to latch circuit lb3. Then the program pulse is supplied. This operation is identical with that described in the case of non-redundancy so that the description will not be repeated. During programming, 0 V is supplied to bit lines BL1 and BL2 which are replaced by the redundant arrangement, so as to prohibit programming.

An erase operation is effected first by raising the thresholds of the memory cells having low thresholds. This process is effected in general by using hot electrons. In the present invention, however, the FN tunnel effect is used to inject electrons from the channel layer into floating gate 7 to raise the threshold level (FIG. 12). This method can be done by setting signals pg0, pg1, pg2, pg3 and pre at a low level and raising the potential of all the control gates (CGs) 5 to about 18 V. This method enables the thresholds of the all the memory cells to be raised even if the circuit contains a bit line defect such as bit line open X1, bit line short-circuit defect X3 or X4.

Next, signal 'erreset' is set at the low state so as to set all the data in latch circuit 13B at the low level state. Subsequently, signal 'data' is set at a high level and cell 'bitsel0' is set at a high level. Resultantly, latch circuit lb0 latches the high state.

Since bit line BL1 is replaced by the redundant arrangement, an unillustrated matching circuit causes signal 'mcd' to become set at the high level, so that column decoder 10 does not open. As a result, latch circuit lb1 continues to keep the low level state.

At the same time, an unillustrated cell 'bitsel' in column decoder circuit for redundancy is set into a high level, and the high level state is latched. The situation of bit line BL2 is the same as bit line BL1. Since bit line BL3 is not replaced by the redundant arrangement, the high level state is latched.

Next, an erase pulse is supplied to each bit line. This method is the same as that of non-redundancy. The difference is that the bit lines being replaced by the redundant arrangement, are floating so that they will not be erased. As a result, the thresholds of the memory cells in the columns of memory cells M1 and M2 are kept at the high state.

A reading operation is carried out in basically the same manner as that described in the first embodiment.

Consequently, it is possible to reduce the number of bit lines for redundancy and hence the area for the redundant array, by setting the thresholds of the memory cells connected to the defective bit lines at the high state.

As has been described heretofore, the second embodiment can produce the same effects as the first embodiment.

Preferred examples of the invention have been presented in the above description of the embodiments, but the present invention should not be limited to this.

For example, the effects of the present invention can be attained by any type of a virtual ground type flash memory.

In the description of the above embodiments, row lines and column lines are specified for description convenience, but the configuration should not be limited to these specifications.

As understood from the above description, in accordance with the first and second features, it is possible to minimize the influences of a defective column line in a non-volatile semiconductor memory of a virtual ground type array. Therefore, it is possible to reduce the number of the columns of floating gate FETs for redundancy and hence reduce the chip area and the production cost.

In accordance with the third feature, if a column line open defect occurs in a non-volatile semiconductor memory of a virtual ground type array, it is possible to compensate the defect with half the number of the columns of floating gate FETs for redundancy, which were required when the columns of floating gate FETs for redundancy were used in a simple manner without setting the thresholds of the memory cells at the high state.

In accordance with the fourth feature, if a short-circuit defect between column lines occurs in a non-volatile semiconductor memory of a virtual ground type array, it is possible to compensate the defect with only three-fourths the number of the columns of floating gate FETs for redundancy, which were required when the columns of floating gate FETs for redundancy were used in a simple manner without setting the thresholds of the memory cells at the high state.

In accordance with the fifth feature, if a short-circuit defect between one column line and the substrate occurs in a non-volatile semiconductor memory of a virtual ground type array, it is possible to compensate the defect with only half the number of the columns of floating gate FETs for redundancy, which were required when the columns of floating gate FETs for redundancy were used in a simple manner without setting the thresholds of the memory cells at the high state.

In accordance with the sixth feature, a means for raising the threshold levels of the floating gate FETs connected to the column lines is provided in a redundancy device for a non-volatile semiconductor memory of a virtual ground type array with redundant memory. Accordingly, it is possible to reduce the number of the columns of floating gate FETs for redundancy compared to conventional configurations, thus contributing to reduction in cost, size and power consumption.

What is claimed is:

1. A redundancy method for a non-volatile semiconductor memory of a virtual ground type wherein the non-volatile virtual ground type semiconductor memory comprises:

a number of electrically programmable and erasable floating gate field effect transistors each having a control gate, a drain and a source, arranged matrix-wise in rows and columns forming an array, so that the control gates of the floating gate field effect transistors constituting each row are connected with one row line and the drains or sources of the floating gate field effect transistors constituting each column are connected with one column line, the method comprising the steps of:

providing one or more column lines for redundancy, with which floating gate field effect transistors at least in the same number as that of the row lines of the array are connected;

when a defect occurs in a column line, setting the thresholds of at least all the floating gate field effect transistors connected to the defective column line, at a high state; and using as the substitute memory, the floating gate field effect transistors for redundancy connected to redundancy column lines in a number as many as those of the floating gate field effect transistors of which the thresholds are set at the high state.

2. A redundancy method for a non-volatile semiconductor memory of a virtual ground type wherein the non-volatile virtual ground type semiconductor memory comprises:

a number of floating gate field effect transistors which each include a control gate having a control gate layer, an inter-layer insulating film and a floating gate, a drain and a source and are electrically programmable and erasable by injecting electrons into, or drawing electrons from, the floating gate by using the FN tunnel effect, and are arranged matrix-wise in rows and columns forming an array, so that the control gates of the floating gate field effect transistors constituting each row are connected with one row line and the drains or sources of the floating gate field effect transistors constituting each column are connected with one column line, the method comprising the steps of:

providing one or more column lines for redundancy, with which floating gate field effect transistors at least in the same number as that of the row lines of the array are connected;

when a defect occurs in a column line, setting the thresholds of at least all the floating gate field effect transistors connected to the defective column line, at a high state;

using as the substitute memory, the floating gate field effect transistors for redundancy connected to redundancy column lines in a number as many as those of the floating gate field effect transistors of which the thresholds are set at the high state; and outputting a programming or erasing voltage to the floating gate field effect transistors for redundancy when the data is programmed or erased.

3. The redundancy method for a non-volatile semiconductor memory according to claim 1 or 2, wherein when the defect occurring in the column line is a column line open, the thresholds of at least two columns of floating gate field effect transistors connected to the defective column line are set at the high state.

4. The redundancy method for a non-volatile semiconductor memory according to claim 1 or 2, wherein when the defect occurring in the column line is a short-circuit between adjoining two column lines, the thresholds of at least three columns of floating gate field effect transistors connected to the defective column lines are set at the high state.

5. The redundancy method for a non-volatile semiconductor memory according to claim 1 or 2, wherein when the defect occurring in the column line is a short-circuit between one column line and the substrate, the thresholds of the floating gate field effect transistors of which the drain is connected to the column line are set at the high state.

6. A redundancy device for a non-volatile semiconductor memory, comprising:

a non-volatile semiconductor memory having a virtual ground type array of a number of floating gate field effect transistors which each include a control gate having a control gate layer, an inter-layer insulating film and a floating gate, a drain and a source, are electrically programmable and erasable by injecting electrons into, or drawing electrons from, the floating gate by using the FN tunnel effect, and are arranged matrix-wise in rows and columns, wherein the control gates of the floating gate field effect transistors constituting each row are connected with one row line and the drains or sources of the floating gate field effect transistors constituting each column are connected with one column line;

a memory for redundancy having the floating gate field effect transistors connected to one redundancy column line or lines in a number at least equal to the number of the rows of the array;

a means for raising the threshold levels of the floating gate field effect transistors connected to one column line or more; and a means for enabling the floating gate field effect transistors connected to the redundancy column line or lines to be used for memory.

* * * * *